United States Patent [19]

Okubo

[11] Patent Number: 4,777,460

[45] Date of Patent: Oct. 11, 1988

[54] THREE-TERMINAL TYPE NOISE FILTER

[75] Inventor: Akira Okubo, Takefu, Japan

[73] Assignee: Murata Manufacturing Co., Ltd., Kyoto, Japan

[21] Appl. No.: 25,989

[22] Filed: Mar. 16, 1987

[30] Foreign Application Priority Data

Apr. 25, 1986 [JP] Japan .............................. 61-63927[U]

[51] Int. Cl.$^4$ .............................................. H03H 7/01
[52] U.S. Cl. ...................... 333/167; 333/12; 333/184; 333/185
[58] Field of Search ................. 333/12, 167, 181–185, 333/175–177; 361/301–306

[56] References Cited

U.S. PATENT DOCUMENTS

| | | | |
|---|---|---|---|
| 4,320,364 | 3/1982 | Sakamoto et al. | 333/185 X |
| 4,563,659 | 1/1986 | Sakamoto | 333/185 X |
| 4,571,561 | 2/1986 | Fujiki et al. | 333/184 |

Primary Examiner—Marvin L. Nussbaum
Attorney, Agent, or Firm—Wenderoth, Lind & Ponack

[57] ABSTRACT

A three-terminal type noise filter has a lead terminal of substantially U-like shape, two magnetic substance cores and a rectangular-plate-like-shaped capacitor which have surfaces which are parallel, the cores being inserted onto both legs of the lead terminal, the capacitor being disposed between the two magnetic substance cores, so that both the cores regulate movement of the capacitor, thereby improving positioning accuracy for the lead terminal and capacitor and raising the reliability of the filter characteristic. Also, one electrode of the capacitor and the head of the lead terminal are electrically connected with each other, a ground lead terminal connected to the other electrode of the capacitor is positioned between the two legs of the lead terminal, and the capacitor is disposed between the cores, thereby enabling the filter to be made small-sized as a whole.

5 Claims, 2 Drawing Sheets

THREE-TERMINAL TYPE NOISE FILTER

The present invention relates to a three-terminal type noise filter, and more particularly to a three-terminal type noise filter which is small-sized, has higher positioning accuracy for a terminal and a capacitor, and of a stable quality and high reliability.

Figure 6:
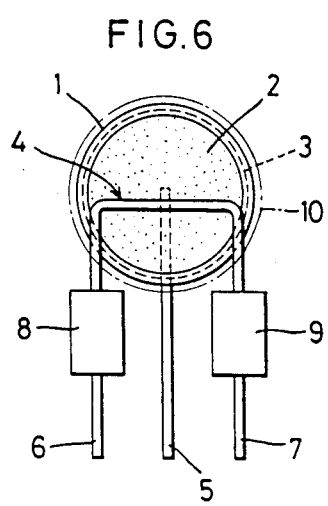
Figure 7:
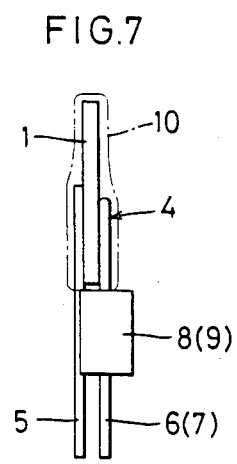

The conventional three-terminal type noise filter, for example, as shown in FIGS. 6 and 7, is provided at both surfaces of a disc-like dielectric substrate 1 with a pair of capacitor electrodes 2 and 3, a substantially U-like-shaped lead terminal 4 is electrically fixedly connected to one capacitor electrode 2 and a ground lead terminal 5 is connected to the other capacitor electrode 3 by soldering or the like respectively, and ferrite beads 8 and 9 are inserted onto both legs 6 and 7 of the lead terminal 4 and fixed thereto with an adhesive or the like respectively.

In addition, the dielectric substrate 1, if needed is covered at the outer periphery with a sheath 10 of insulating resin or the like.

Figure 4:
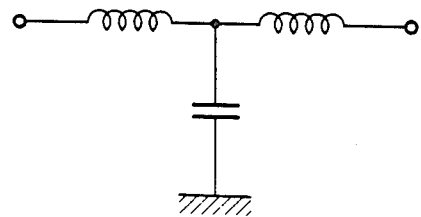
Figure 8:
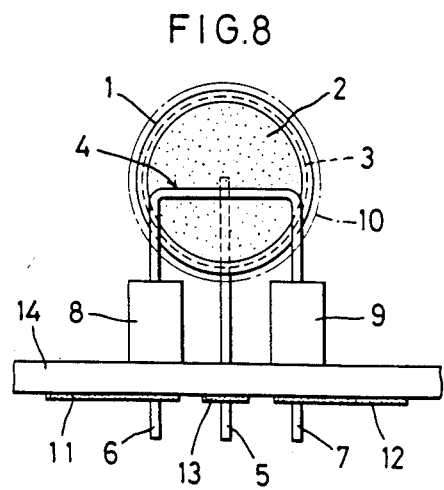

The conventional three-terminal type noise filter constructed as above-described has an equivalent circuit as shown in FIG. 4, and is used, as shown in FIG. 8, by mounting on a printed circuit board 14 provided at the rear surface with input and output conductors 11 and 12 and a ground conductor 13, both the legs 6 and 7 of lead terminal 4 and the ground terminal 5 being inserted from the front surface of the printed circuit board 14 into bores (not shown) formed therein within the patterns of conductors 11, 12 and 13 and connected therewith by soldering or the like.

Such conventional three-terminal type noise filter, however, is held in position on the dielectric substrate 1 only by the lead terminal 4 and ground lead terminal 5, whereby the dielectric substrate 1 is easy to move during processing prior to soldering the terminals 4 and 5 to the capacitor electrodes 2 and 3 and the positional relation between the terminal 4 and the dielectric substrate 1 is not fixed, resulting in that the quality of the filter is not stable, the reliability deteriorates, the positioning is difficult, and the productivity is reduced.

Also, since the ferrite beads 8 and 9 are inserted onto both the legs 6 and 7 of the lead terminal 4 below the dielectric substrate 1, the filter becomes larger in height as a whole and large-sized.

Furthermore, as shown in FIG. 8, the ferrite beads 8 and 9 are disposed to abut at the lower surfaces thereof against the surface of the printed circuit board 14 so that the ground lead terminal 5 is longer by the extent of the length of each ferrite bead 8 or 9, thereby generating a useless inductance component at the longer portion. Hence, when the three-terminal type noise filter is used to eliminate an unwanted noise component superposed on the input and output conductors 11 and 12, the filter characteristic is deteriorated.

Figure 9:
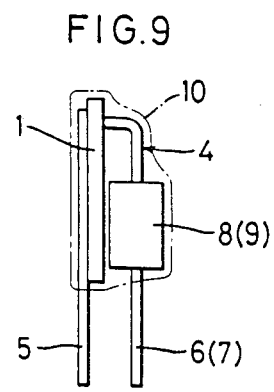

In order to solve the above problems, for example, when the ferrite beads 8 and 9, as shown in FIG. 9, are placed on the dielectric substrate 1, the filter is smaller in height, and when the filter is mounted on the printed circuit board 14, the ground lead terminal 5 is reduced in length which results in an improvement in the filter characteristic, but the product is larger in thickness as a whole and still large-sized.

Such noise filter is held in in position on the dielectric substrate 1 between both the lead terminals 4 and 5 the same as the conventional example shown in FIGS. 6 and 7, whereby the quality of the filter is not stable, the reliability thereof deteriorates, and the productivity of the same reduced.

A first object of the present invnetion is to provide a three-terminal type noise filter which has superior positioning accuracy of the lead terminal on the capacitor and high reliability of the filter characteristic.

A second object of the present invention is to provide a three-terminal type noise filter which can be small-sized as a whole so as to be effective in mounting.

A third object of the present invention is to provide a three-terminal type noise filter in which it is easy to position the lead terminal on the capacitor, thereby enabling an improvement in productivity.

A fourth object of the present invnetion is to provide a three-terminal type noise filter which can reduce the lead terminal length to prevent the lead terminal from generating an unwanted inductance component.

These and other objects, features and advantages of the invention will become more apparent upon a reading of the following detailed specification and drawings.

Figure 1:
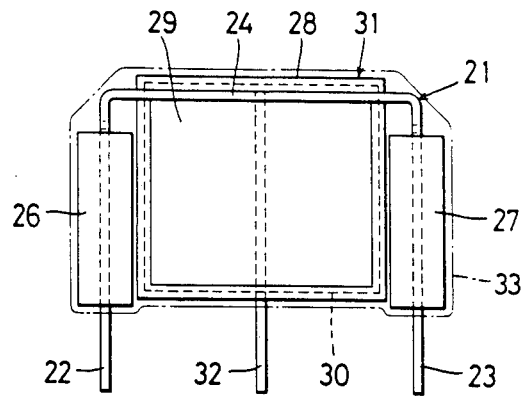
Figure 2:
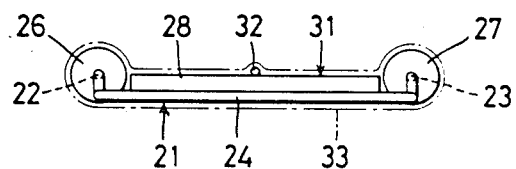
Figure 3:
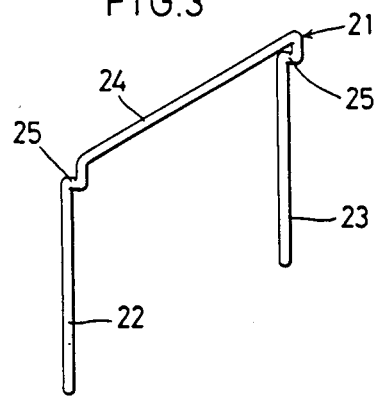
Figure 5:
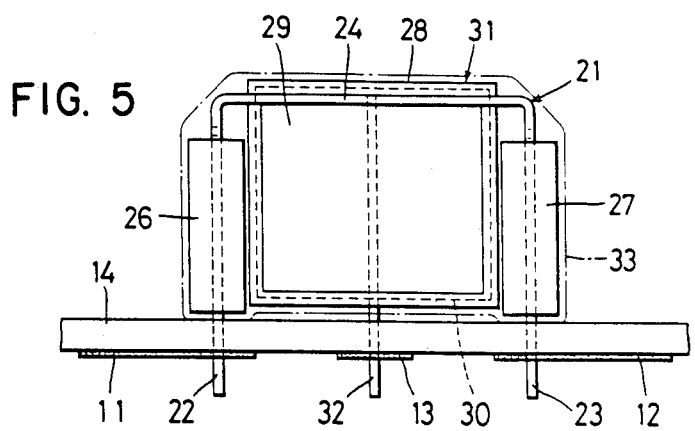

FIG. 1 is a front view of an embodiment of a three-terminal type noise filter of the invention, FIG. 2 is a bottom view of the FIG. 1 embodiment, FIG. 3 is a perspective view of a lead terminal used for the three-terminal type noise filter of the invention, FIG. 4 is an equivalent circuit diagram of a three-terminal type noise filter, FIG. 5 is a front view showing mounting of the embodiment of the invention on a circuit board, FIG. 6 is a front view of a conventional three-terminal type noise filter, FIG. 7 is a side view thereof, FIG. 8 is a front view showing mounting of the same on a circuit board, and FIG. 9 is a side view of another example of a conventional three-terminal type noise filter.

Referring to FIGS. 1 and 2, reference numeral 21 designates a lead terminal having a round cross-section and having a substantially U-like shape including two legs 22 and 23 and a head 24 formed therebetween, the lead terminal 21, as shown in FIG. 3, being bent at the legs 22 and 23 to form stepped portions 25 at the head 24 end, 26 and 27 designate ferrite beads of magnetic core substance, which are inserted onto the legs 22 and 23 of the lead terminal 21 respectively, the legs 22 and 23 have increased strength and being hard to deform because the stepped portions 25 are formed in the legs 22 and 23 at the head 24 end, thereby facilitating insertion of the ferrite beads 26 and 27 onto both the legs 22 and 23 respectively, and 28 designates a dielectric substrate of a rectangular-plate-like shape and having both surfaces parallel, on the surfaces of which a pair of capacitor electrodes 29 and 30 are formed to constitute a capacitor 31, the capacitor 31 being disposed between the ferrite beads 26 and 27 at the stepped portion 25 ends and adjacent to the ferrite beads 26 and 27 in relation of the movement being regulated to ensure the positioning of the capacitor 31. An intermediate portion of the head 24 of the lead terminal 21 and one electrode 29 of the capacitor 31 are electrically connected with each other by soldering or the like, the lead terminal 21 and capacitor 31 thus being fixed to each other.

Reference numeral 32 designates a ground lead terminal. The ground lead terminal 32 is electrically connected at one end thereof with the other electrode 30 of the capacitor 31 by soldering or the like, fixed to the capacitor 31, and disposed between the legs 22 and 23 of the lead terminal 21.

Also, when, for example, the portions of the head 24 of the lead terminal 21 and one end of the earth lead terminal 32 to be electrically connected with the electrodes 29 and 30 of the capacitor 31 are squash-molded, i.e. flattened, so as to be larger in width than other portions, this will improve the reliability of soldering and also ensure holding of the capacitor 31 between the terminals 21 and 32. In this embodiment, since the capacitor 31 is disposed against a side of the stepped portion 25 at the head 24 of the lead terminal 21, both the legs 22 and 23 of lead terminal 21 and the ground lead terminal 32 can be disposed with ease in the same plane. Reference numeral 33 designates a sheath of insulating resin formed on the outter peripheries of the ferrite beads 26 and 27 and capacitor 31.

The three-terminal type noise filter of the invention constructed as described has an equivalent circuit as shown in FIG. 4, and is used in a manner in which, as shown in FIG. 5, a printed circuit board 14 is provided at the rear surface thereof with input and output conductor patterns 11 and 12 and a ground conductor pattern 13, and bores (not shown) within the patterns 11, 12 and 13 respectively are formed in the printed circuit board 14, the both legs 22 and 23 of lead terminal 21 and the earth lead terminal 32 are inserted into the bores from the surface of the printed circuit board 14 and connected with the patterns 11, 12 and 13 by soldering or the like respectively.

Incidentally, the three-terminal type noise filter of the invention is not confined to the above-described embodiment, but may be modified without changing the scope and spirit of the invention.

For example, it is not indispensable that the capacitor 31 be disposed adjacent to the ferrite beads 26 and 27, but there may be gaps between the capacitor 31 and the ferrite beads 26 and 27 to an extent of not making inaccurate the positioning of the capacitor 31.

Also, the round cross-section of the lead terminal 21 may alternatively be of other shapes.

I claim:
1. A three terminal type noise filter comprising:
a plate-shaped capacitor having opposite parallel surfaces and opposite side edge portions along the sides thereof and having a pair of electrodes on the opposite surfaces;
a substantially U-shaped lead terminal having a head portion extending between two leg portions each having one end connected to said head portion and the other ends as free ends, said head portion being electrically connected to the electrode on one of the opposite surfaces of said capacitor and extending past the opposite side edge portions;
a magnetic substance core on each of said leg portions and lying along said opposite side edge portions of said capacitor with said capacitor between said cores; and
a ground lead connected to the electrode on the other of said opposite faces of said capacitor and extending away therefrom parallel to said leg portions and being positioned between the free ends of said leg portions.
2. A noise filter as claimed in claim 1 wherein said leg portions of said lead terminal are bent at the one ends thereof to form stepped portions extending from the one opposite surface of said capacitor to the other opposite surface of said capacitor, whereby said ground lead is in substantially the same plane as the parts of said leg portions extending from said stepped portions to said free ends.
3. A noise filter as claimed in claim 1 wherein said opposite edge portions of said capacitor are adjacent and close to said magnetic substance cores on said leg portions.
4. A noise filter as claimed in claim 1 in which said lead terminal has a round cross-section.
5. A noise filter as claimed in claim 4 in which said head portion has an intermediate portion which has a larger width than the diameter of said round cross-section, and said larger width portion is soldered to the electrode on said one surface of said capacitor.

* * * * *